United States Patent [19]

Scarpetti, Jr. et al.

[11] Patent Number: 5,416,381

[45] Date of Patent: May 16, 1995

[54] SELF ALIGNING ELECTRON BEAM GUN HAVING ENHANCED THERMAL AND MECHANICAL STABILITY

[75] Inventors: Raymond D. Scarpetti, Jr.; Clarence D. Parkison; Vernon A. Switzer, all of Livermore; Young J. Lee, Sunnyvale; William C. Sawyer, Manteca, all of Calif.

[73] Assignee: The United States of America as represented by the United States Department of Energy, Washington, D.C.

[21] Appl. No.: 101,161

[22] Filed: Aug. 3, 1993

[51] Int. Cl.$^6$ ............................................. H01J 29/46
[52] U.S. Cl. ..................................... 313/446; 445/34
[58] Field of Search ........... 313/446, 451, 447, 346 R, 313/346 DC, 270; 445/34

[56] References Cited

U.S. PATENT DOCUMENTS

| | | | |
|---|---|---|---|
| 2,732,512 | 1/1956 | Briggs, Jr. | 313/446 |
| 4,607,187 | 8/1986 | Villanyi | 445/34 |
| 4,990,823 | 2/1991 | Swaving et al. | 313/446 |

FOREIGN PATENT DOCUMENTS

405166458A  7/1993  Japan ................................... 445/34

OTHER PUBLICATIONS

Book, *Introduction to Electron Beam Technology*, Chapter 3, "Electron gun design," by L. H. Leonard, Published by John Wiley & Sons, Inc., pp. 70–95. undated.
Advertisement by Von Ardenne Anlagentechnik GmbH, "EH 30/20 High-Power Electron Beam Gun," 1 page in length. undated.
Advertisement by Von Ardenne Anlagentechnik GmbH, "EN 80/30 High-Power Electron Beam Gun," 1 page in length. undated.
Advertisement by Von Ardenne Anlagentechnik GmbH, "EH 300/35 High-Power Electron Beam Gun," 1 page in length. undated.
Advertisement by Von Ardenne Anlagentechnik GmbH, "EH 600/40 High-Power Electron Beam Gun," 1 page in length. undated.
Advertisement by Von Ardenne Anlagentechnik GmbH, "EH 1200/50 High-Power Electron Beam Gun," 1 page in length. undated.
Book, *Electron Beam Technologies*, Chapter 2, "Electron Guns", Section 2.5, by S. Schiller, U. Heisig, and S. Panzer, Published by John Wiley & Sons, Inc., 1982, pp. 134–137.

*Primary Examiner*—Sandra L. O'Shea
*Assistant Examiner*—Vip Patel
*Attorney, Agent, or Firm*—Miguel A. Valdes; Roger S. Gaither; William R. Moser

[57] ABSTRACT

A compact, high power electron gun having enhanced thermal and mechanical stability which incorporates a mechanically coupled, self aligning structure for the anode and cathode. The enhanced stability, and reduced need for realignment of the cathode to the anode and downstream optics during operation are achieved by use of a common support structure for the cathode and anode which requires no adjustment screws or spacers. The electron gun of the present invention also incorporates a modular design for the cathode, in which the electron emitter, its support structure, and the hardware required to attach the emitter assembly to the rest of the gun are a single element. This modular design makes replacement of the emitter simpler and requires no realignment after a new emitter has been installed. Compactness and a reduction in the possibility of high voltage breakdown are achieved by shielding the "triple point" where the electrode, insulator, and vacuum meet. The use of electric discharge machining (EDM) for fabricating the emitter allows for the accurate machining of the emitter into intricate shapes without encountering the normal stresses developed by standard emitter fabrication techniques.

11 Claims, 4 Drawing Sheets

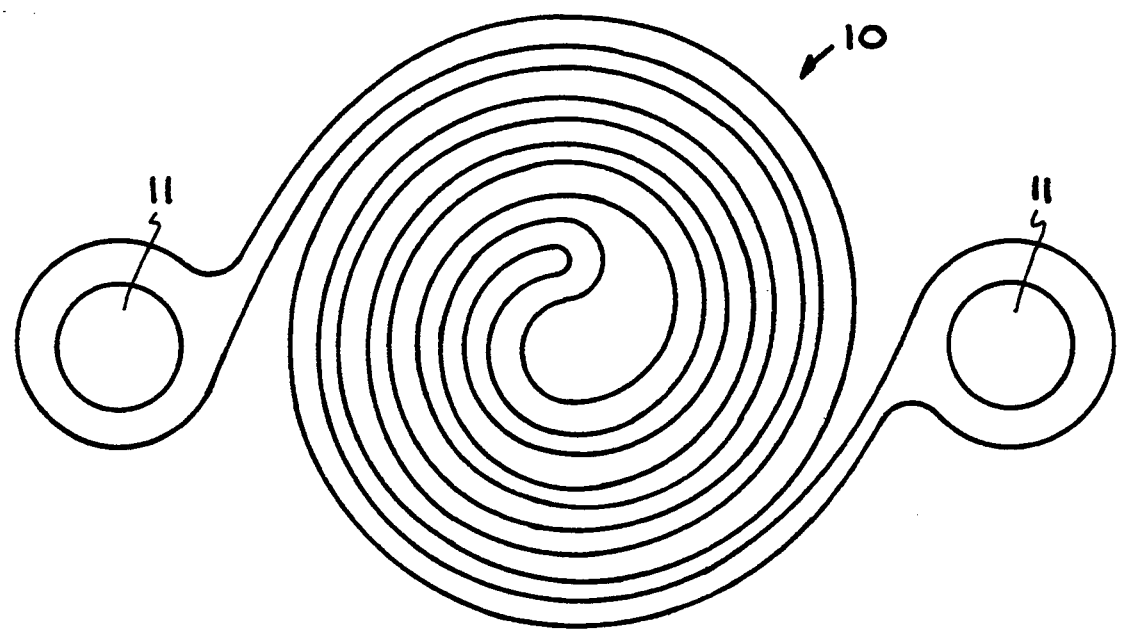
FIG. 2
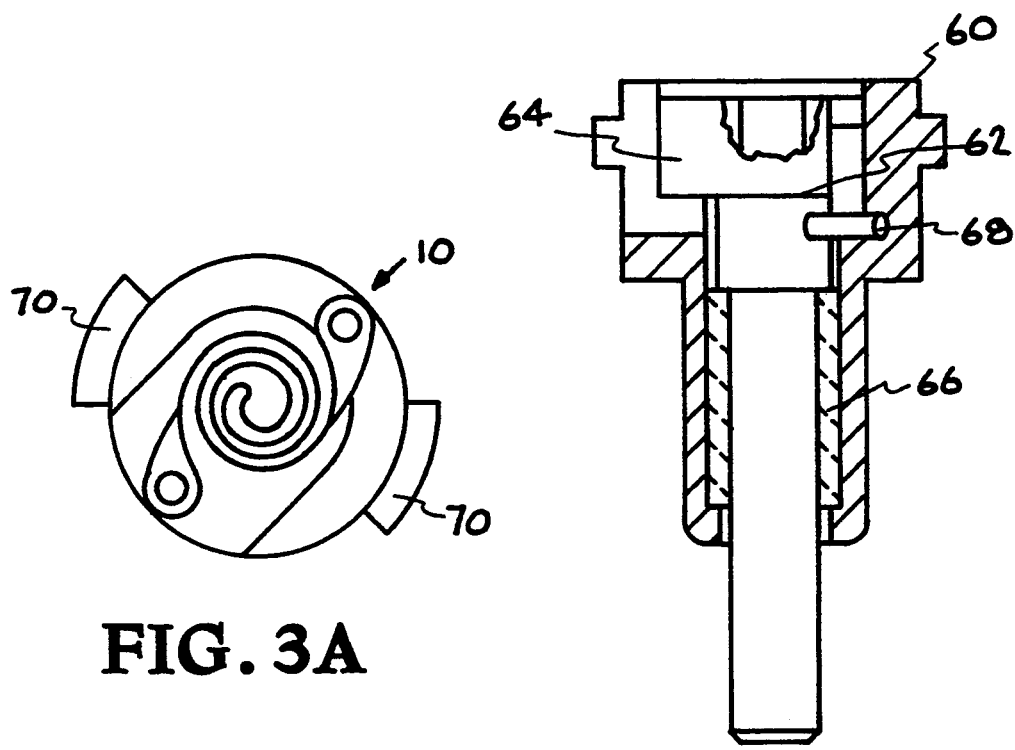
FIG. 3A
FIG. 3B

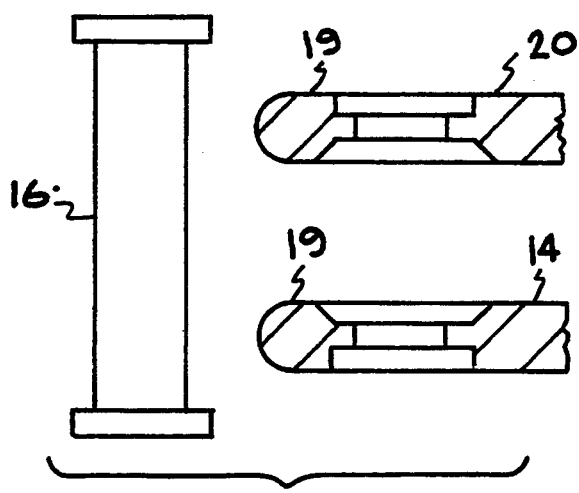
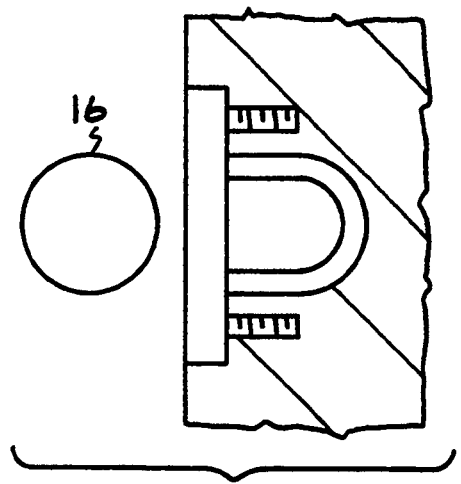
FIG. 4A-1      FIG. 4A-2
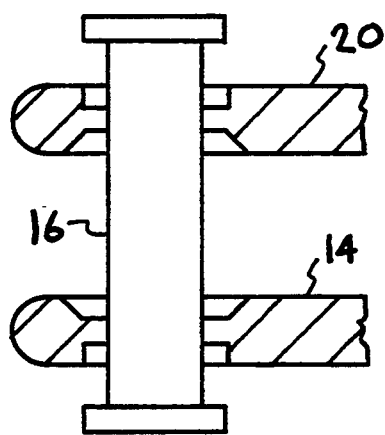
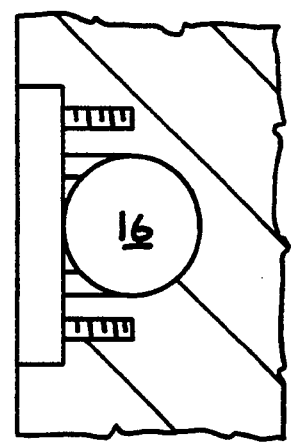
FIG. 4B-1      FIG. 4B-2
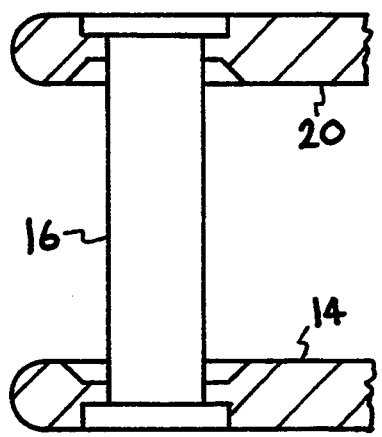
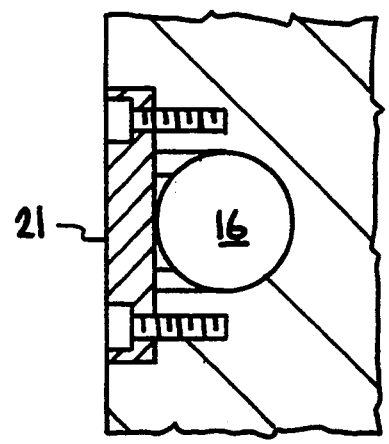
FIG. 4C-1      FIG. 4C-2

SELF ALIGNING ELECTRON BEAM GUN HAVING ENHANCED THERMAL AND MECHANICAL STABILITY

The U.S. Government has rights to this invention pursuant to Contract No. W-7405-ENG-48 between the U.S. Department of Energy and the University of California, for the operation of the Lawrence Livermore National Laboratory.

TECHNICAL FIELD

The present invention is generally directed to electron guns which produce an electron beam, and more specifically, to a design for a self-aligning electron beam gun which has enhanced thermal and mechanical stability.

BACKGROUND OF THE INVENTION

An electron beam gun is a device which generates, accelerates, and focuses a beam of electrons. The elements of an electron gun can be divided into two broad categories: (1) the elements needed to generate free electrons, i.e., the cathode elements, and (2) the elements needed to shape, focus, and direct the electrons into a useful beam.

A primary use of electron beam guns is in the field of materials processing. Such guns can be used to evaporate or melt metals, alloys, and compounds. They can also be used to refine materials in order to produce very pure and strong materials, such as superalloys. Another common use of such guns is as a means of performing surface heat treatments of materials. With a sufficiently small beam size (on the order of 1 mm$^2$ or less), the beam produced by such guns can also be used for cutting, welding, or drilling operations.

Standard electron beam guns consist of a cathode or emitter, which provides a source of electrons, and cathode and anode electrodes which produce an electric field between them for the purpose of accelerating the electrons produced by the emitter and guiding them into a transport or deflection system. The cathode and anode electrodes are usually separated and held in place by means of insulators, which provide structural rigidity and prevent a breakdown of the electric field between the electrodes.

The transport or deflection system typically consists of one or more assemblies which produce magnetic fields and are used to focus (converge) and direct the electron beam. The focused beam exits the electron beam gun and enters a magnetic transport system which directs it to the intended target. The interior of the gun, or the gun and target themselves may be contained within a vacuum in order to prevent beam divergence or loss of power due to interactions with the ambient environment.

The cathode, which is the source of electrons, can be a current carrying filament, a solid block which is indirectly heated by radiation from a filament, or it may be a material which is heated by an electron beam produced by another source. Cathodes can be characterized by their work function, which is the amount of energy (typically expressed in electron volts) required to overcome the potential barrier at their surface and result in the liberation of electrons.

In the case of a metal cathode, if such a cathode is heated sufficiently, some of the conduction electrons in the metal acquire enough energy to overcome the surface potential barrier and can be drawn off by a suitable electric field. If the field is high enough so that it draws off all the available electrons from a cathode of work function $\Psi$, the saturation current density J (in amps per cm$^2$) produced at temperature T, is given by the Richardson-Dushman equation:

$$J = A_o T^2 \exp(-e\Psi/kT), \quad (1)$$

where $A_o$ is a constant whose value depends on the cathode material and usually has a value of 120 amps per cm$^2$ deg$^2$e, is the charge on an electron and k is Boltzmann's constant.

There are several standard designs for electron guns, with the specific type used depending somewhat on the intended application. One of the most common designs is termed a "Pierce" gun which is designed to be operated with a space-charge limited cathode, i.e., operation of the emitter at less than the maximum value of the theoretically possible saturation current density. This mode of operation has the advantage that a smaller, virtual cathode is formed slightly in front of the physical cathode, with the virtual cathode having a stable and uniform electron current density which is independent of cathode temperature. A Pierce type gun also produces a uniform current density over the beam cross-section, and is capable of operating at a high level of efficiency.

During operation of an electron beam gun, it is important that the gun cathode, anode, and deflection system be properly aligned. This is because misalignment of these components can lead to a decline in the gun's performance. Such a decline in performance may be exhibited as a reduction in the beam quality, shape, or current (which reduces the power contained in the beam). The effects of misalignment are also observed in problems with beam steering and the potential for excessive heating of surrounding components of the gun. In existing electron gun designs, proper alignment is accomplished by means of adjusting screws and spacers which alter the relative positions of the gun's components.

The need for maintaining proper alignment illustrates a disadvantage of many existing, commercially available electron guns. Such guns support the cathode element from behind by means of a combination of joints, welds, flanges, and other mechanically coupled structures. During operation of the electron gun, the thermal expansion and distortion of these components can cause the cathode to become misaligned relative to the anode and downstream electron optics. Thus, present designs for commercially available electron guns are subject to problems associated with the use of adjustment screws and spacers, i.e., difficulties in achieving proper alignment and down time while the gun is out of operation. Present designs also require many parts and assembly steps which can lead to a large accumulation of error in the final product, as well as inconsistencies from gun to gun, all of which can affect gun system performance. Minimizing the number of components has the additional benefit of reducing the amount of parts stocking required.

Another problem common to many commercially available electron guns concerns the ease with which the electron source, i.e., the cathode or emitter may be replaced. Emitter failure is a common limiting factor on the lifetime of electron guns, and is usually dealt with by replacing the entire emitter assembly. In most existing guns, replacement of the emitter requires disassembly of the gun and the subsequent realignment of the emitter so that the gun's performance is not degraded. This can be time consuming and can impact the goals of the program for which the gun is being used. In some cases it may also be necessary or desirable to modify the emitter design, or to completely redesign the emitter assembly to achieve improved gun operation. This can be a problem in existing guns because the emitter assembly is an integral part of the cathode structure, so that it is difficult to modify its design without having an impact on the overall design of the cathode structure.

Yet still another problem with some designs for electron beam guns arises because the "triple point" where the insulators, electrodes, and vacuum meet can be the site of a breakdown in the high voltage electric field between the electrodes. Such a breakdown is capable of disrupting the operation of the gun and is usually prevented by spacing the electrodes a sufficient distance apart. This impacts the size, weight, bulkiness, and cost of the gun, which may affect its usefulness and performance, as well as limit future applications.

What is desired is a compact electron gun which has greater thermal and mechanical stability than presently available guns, a design such that the cathode is easier to align with respect to the anode and downstream optics, and in which the emitter or electron source can easily be replaced.

SUMMARY OF THE INVENTION

The present invention is directed to a compact, high power electron gun having enhanced thermal and mechanical stability which incorporates a mechanically coupled, self aligning structure for the anode and cathode. Enhanced stability and a reduced need for realignment of the cathode to the anode and downstream optics during operation are achieved by use of a common, compact, and simple support structure for the cathode and anode which does not require adjustment screws or spacers.

The electron gun of the present invention also incorporates a modular design for the cathode, in which the electron emitter, its support structure, and the hardware required to attach the emitter assembly to the rest of the gun cathode assembly are a single element. This modular design makes replacement of the emitter simpler and requires no adjustment after a new emitter has been installed. Compactness and a reduction in the possibility of high voltage breakdown are achieved by extensive shielding of the "triple point", e.g., that point where the electrode, insulator, and vacuum meet.

Further objects and advantages of the present invention will become apparent from the following detailed description and accompanying drawings.

BRIEF DESCRIPTION OF THE DRAWINGS

FIG. 2 is a top view of the emitter or cathode element of the electron beam gun of the present invention.

FIGS. 3A and 3B are a top and side view, respectively, of the cathode assembly of the electron beam gun of the present invention.

FIGS. 4A-4C show the steps involved in assembling the cathode, insulators, and anode assemblies of the electron beam gun of the present invention.

DETAILED DESCRIPTION OF THE PREFERRED EMBODIMENTS

Figure 1:
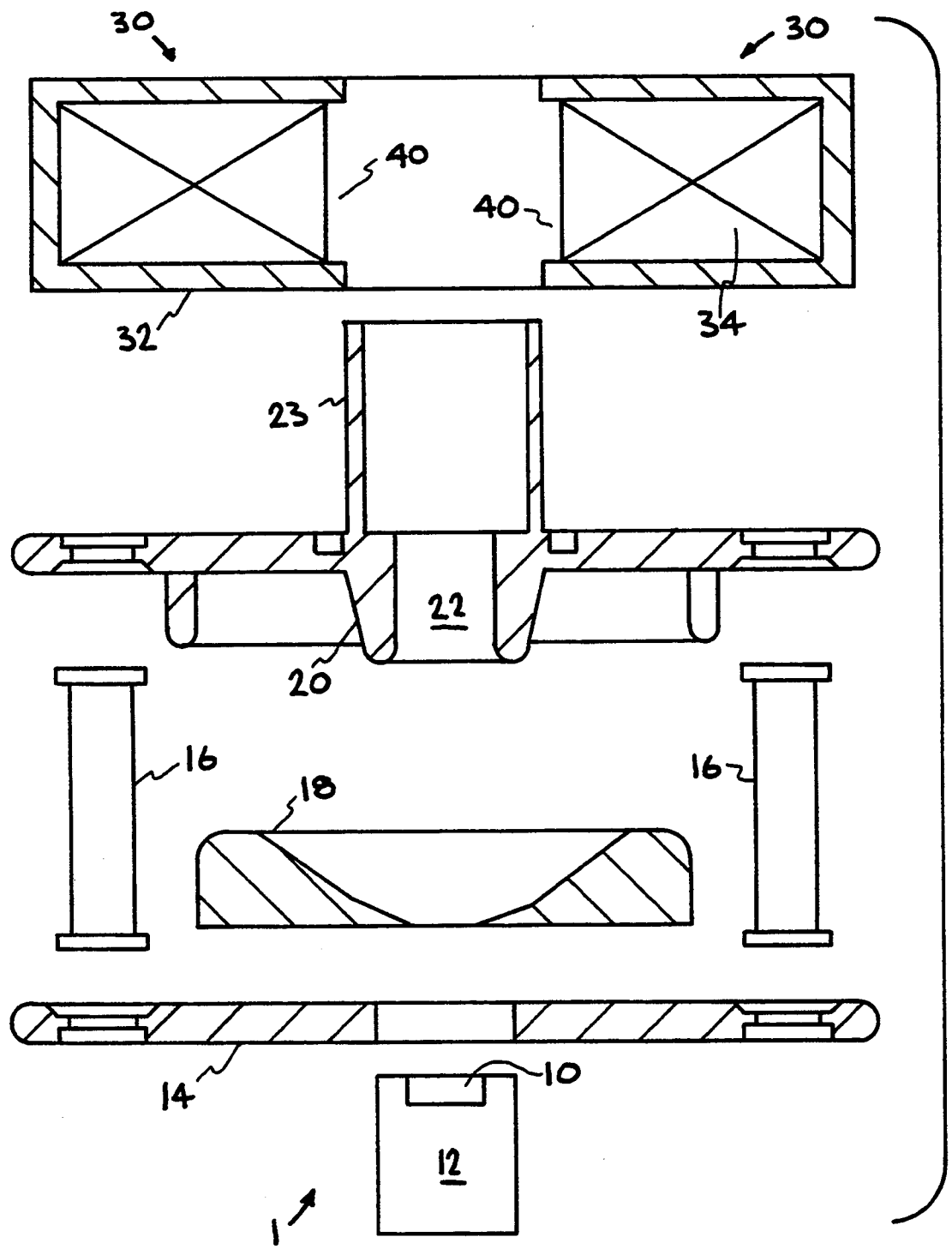
FIG. 1 is an exploded side view of the electron beam gun of the present invention which shows its constituent assemblies.

Referring to the drawings, and in particular to FIG. 1, there is shown an exploded side view of an electron beam gun 1 of the present invention. FIG. 1 shows the constituent assemblies of electron beam gun 1 and their respective alignment prior to assembly. Electron beam gun 1 includes a cathode or emitter 10 which serves as a source of electrons and which is contained in a cathode assembly 12. Emitter 10 is a directly heated, current carrying tungsten filament.

As shown in FIG. 2, which is a top view of cathode or emitter 10, emitter 10 is preferably of a bifilar design so as to reduce the magnetic field generated by the heating current passing through the filament. If not cancelled out, this magnetic field would act as a magnetic focusing lens and disturb the electrostatic focusing of the gun's anode and cathode structures.

In the working model of electron beam gun 1 of the present invention constructed by the inventors, the tungsten filament of emitter 10 is fabricated from 0.060±0.005 inch thick tungsten plate having a purity of 99% or better by the technique of Electric Discharge Machining (EDM). EDM allows for the accurate and intricate machining required in the filament design, yet does not introduce stresses of the type encountered when tungsten wire is bent into a desired shape and used as an emitter. The difference in the orientation of the tungsten grain in the plate material as compared to that in wire does not seem to affect the operation of emitter 10. The filament of emitter 10 is 0.045 inches wide with 0.030 inches between adjacent wraps. The actual dimensions of emitter 10 are not critical and can be adjusted to better suit the application or power supply being used. Two mounting holes 11 on the filament allow for its attachment to cathode holder assembly 12. This attachment is accomplished using molybdenum shoulder bolts. During normal operation, i.e., filament temperatures of approximately 2600° C. a nominal current of 100 amperes DC passed through the filament with a voltage drop of 13 volts. Power is supplied to the filament through leads attached to the lower portions of outer housing 60 and inner post 62 (shown in FIGS. 3A and 3B).

FIGS. 3A and 3B are a top and side view, respectively, of cathode assembly 12 of electron beam gun 1 of the present invention. As shown in these figures, emitter filament 10 is mounted in cathode assembly 12 which is made of molybdenum. Outer housing 60 of cathode assembly 12 connects to one end of tungsten filament 10. Outer housing 60 is designed to fit into cathode support or base plate 14 of FIG. 1 and, with 0.001 inch tolerances, aligns and centers itself. Cathode assembly 12 can thus be installed or removed and reinstalled without affecting the overall alignment of electron beam gun 1. Located in the center of outer housing 60 is inner post 62 which is also made of molybdenum. A lobe 64 is located on the top of inner post 62 and serves as the other connection to emitter filament 10. A single ceramic bushing 66 serves to isolate outer housing 60 from inner post 62 while a 0.125 inch solid ceramic rod 68 pins the parts together. For added strength and ruggedness, solid ceramic rod 68 can be replaced with a tantalum rod and ceramic bushing combination (not shown). The ceramic bushing is inset into inner post 62 and serves to electrically isolate the tantalum rod from inner post 62.

Cathode assembly 12 is attached to cathode support plate 14 of FIG. 1 in a bayonet fashion. Cathode assembly 12 has ears 70 which fit into cathode support plate 14. After insertion, cathode assembly 12 is rotated 30 degrees and pressed into final position by means of two #4-40 set screws which are preferably made of molybdenum, but may also be made of steel or any other high melting point material. The top of cathode assembly 12 fits snugly into cathode support plate 14 for accurate positioning. Cathode emitter assembly 12 thus fits into the combination of cathode support plate 14 and cathode focus electrode 18 of FIG. 1, with the benefit of automatically aligning itself relative to those elements. Note that although cathode support plate 14 and cathode focus electrode 18 are shown as two separate pieces in FIG. 1, they can also be configured as a single part. Cathode support plate 14 is attached to anode 20 by means of one or more high voltage insulators 16 as shown in FIG. 1.

During operation, electrons produced by cathode 10 are drawn off of cathode 10, accelerated, and directed through aperture 22 in anode 20 as shown in FIG. 1 by means of an electric field which is formed between cathode focus electrode 18 and anode 20. Cathode support plate 14 is directly and electrically connected to cathode focus electrode 18. The electron beam so formed (not shown) is subjected to further focusing and directed to a magnetic transport system (not shown) which directs the beam to its intended target (not shown) by means of focus coils 30, which typically consist of iron poles 32 and coil windings 34. Cooling channels 40 may be used to circulate a coolant, such as water, around focus coils 30 to prevent overheating of coils 30 and/or the anode structure, and malfunction of electron beam gun 1. Electron beam gun 1 and its related magnetic transport system and target may be enclosed in a vacuum chamber to prevent degradation of the beam due to the effects of interactions with the ambient environment.

FIGS. 4A–4C show the steps involved in assembling cathode support plate 14, insulators 16 and anode 20 of electron beam gun 1 of the present invention. Note that FIGS. 4A-1, 4B-1, and 4C-1 show side views of the assembly of these elements, while FIGS. 4A-2, 4B-2, and 4C-2 show the corresponding top views. As shown in FIGS. 4A-1 and 4A-2, anode 20 and cathode support plate 14 (on which rests cathode electrode 18 and into which has been inserted cathode assembly 12) are first brought in close proximity to insulator or insulators 16. Anode 20 and cathode support plate 14 are then placed around insulator 16 by inserting insulator 16 into the openings in those structures, as shown in FIGS. 4B-1 and 4B-2. Anode 20 and cathode support plate 14 are then spread apart so that insulator 16 becomes properly seated in the openings, as shown in FIGS. 4C-1 and 4C-2. Insulators 16 can be secured in place using set screws or clamps 21 located on cathode support plate 14 and anode 20. Proper alignment is achieved by tight machining tolerances ($\pm 0.0005$ inch) on shoulder steps 19 machined in anode 20 and cathode support plate 14, and shoulders 17 of insulator 16.

Figure 5:
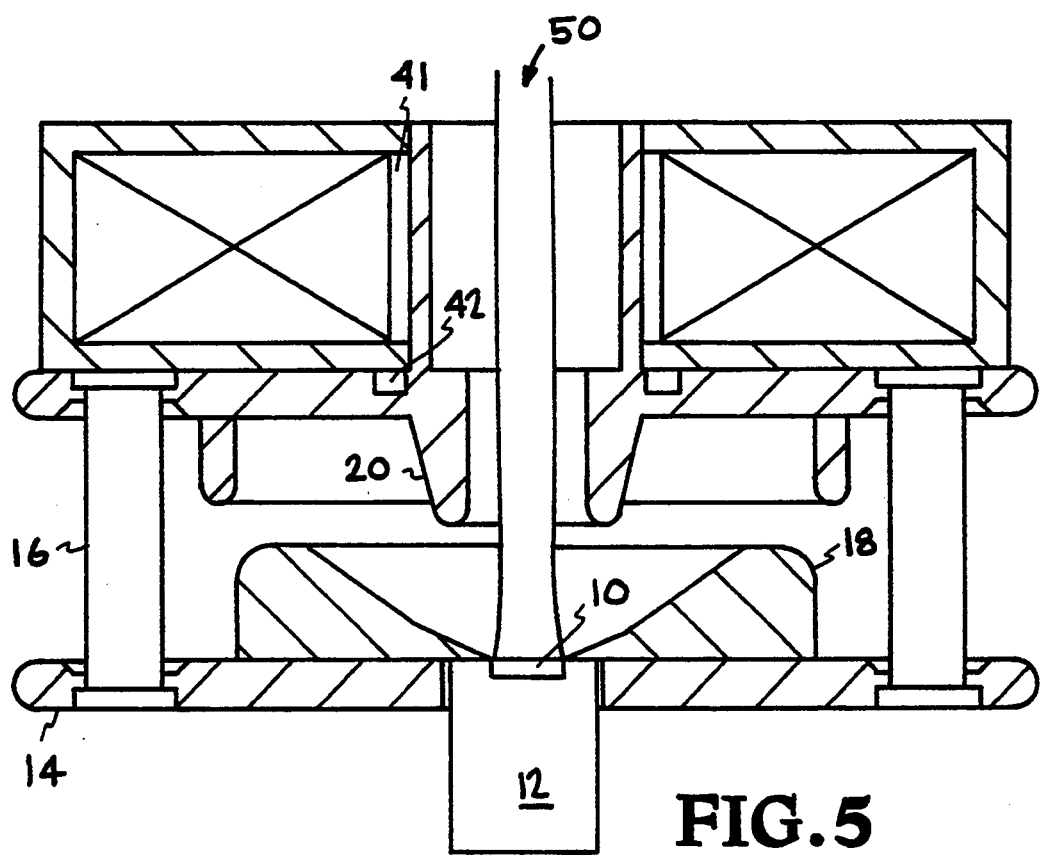
FIG. 5 is a side view of the electron beam gun of FIG. 1 after its assembly.

FIG. 5 is a side view of electron beam gun 1 of FIG. 1 after its assembly. The numbers in FIG. 5 refer to the same elements, respectively as in FIG. 1. Also indicated is the path of an electron beam 50 generated by electron beam gun 1. Based on this method of coupling the cathode and anode, electron beam gun i of the present invention offers several benefits over present designs for electron beam guns.

Firstly, this method provides a symmetrical as well as a mechanically and thermally stable design by virtue of positively locking the components into place in their desired relative positions. This means that the effect of temperature increases or motion on the operation of electron beam gun 1 are minimized since cathode support plate 14 and anode 20 are directly and symmetrically coupled together. Thus, any expansion, contraction, or other movement of one component, which in other circumstances might lead to a change in the relative positions of cathode 10 and anode 20, instead has little effect on the stability of the device.

Secondly, because the components are locked into place, the desired alignment of the cathode, anode, and downstream optics is maintained, making it less susceptible to becoming misaligned due to variations in temperature and operating conditions. Thirdly, because the "triple point", e.g., the point where the cathode or anode, insulator base, and vacuum meet (identified by the label TP in FIG. 5) is shielded by being surrounded by the cathode support plate 14 or anode 20, the possibility of a breakdown of the strong electric field which exists between cathode focus electrode 18 and anode 20 is greatly reduced. This allows cathode support plate 14, which is at high voltage, and anode 20, which is grounded, to be brought closer together than in conventional electron gun designs. This permits the fabrication of a more compact, more rugged, lower cost, and more versatile electron gun which has enhanced stability over presently available designs. Fourthly, by using three or more high voltage insulators, the electron gun can be positioned for operation in any orientation, i.e., horizontally, vertically, upside down, or at an angle.

In accordance with the present invention, another important feature of electron beam gun 1 is that cathode 10 and cathode assembly 12 form a modular unit which can be readily replaced without the need for disassembling, and hence realigning the components of electron beam gun 1. This is because cathode assembly 12 maintains a stable and positive fit with cathode support plate 14, which therefore provides a self-aligning capability with reference to the remaining components of electron beam gun 1. This is similar to the self-aligning capability of the cathode, anode, and downstream optics which is achieved as a result of the positive fit maintained between cathode support plate 14, anode 20, and insulators 16. Furthermore, no aligning shims or screws are used, thus reducing the number of parts and assembly steps required. Another important feature of the present invention is the use of EDM (Electric Discharge Machining) in the fabrication of emitter 10. The use of EDM permits the accurate and intricate machining of electron emitter 10 without inducing stresses which can lead to warpage of the cathode upon thermal heat up and subsequent cycling.

Figure 6:
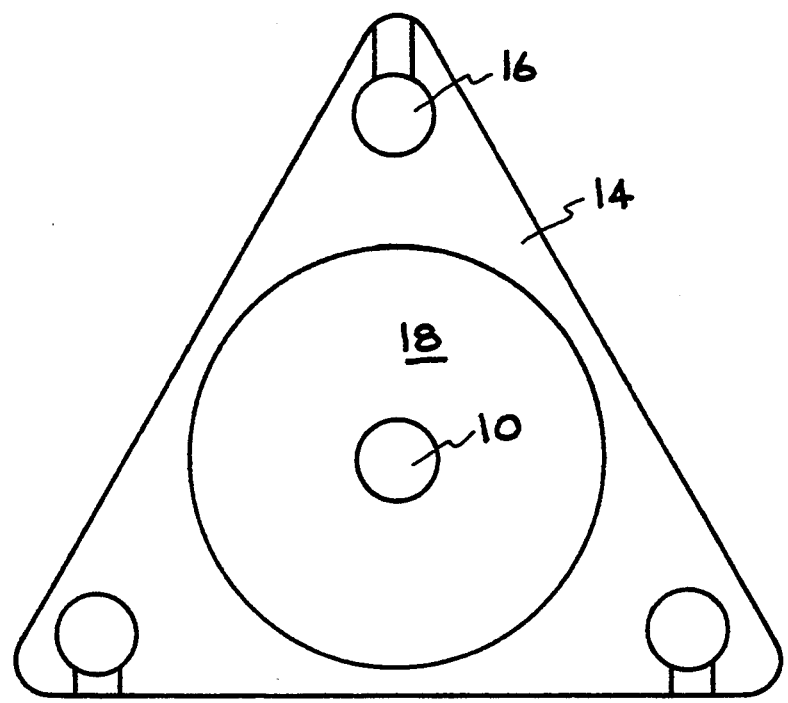
FIG. 6 is a top view of the cathode support structure and associated components of the electron beam gun of the present invention.

FIG. 6 is a top view of cathode assembly 1 (indicated by the broken circle), cathode support plate 14, and the associated components of electron beam gun 1 of FIGS. 1 and 5. As previously noted, cathode assembly 12 contains cathode emitter 10 and fits into cathode support plate 14. Cathode focus electrode 18 is also shown in the figure. As indicated in the discussion of FIGS. 1 and 5, high voltage insulators 16 are used to mechanically couple the anode and focus coil assemblies (not shown) to cathode support plate 14 in order to provide a high degree of symmetry and thermal and mechanical stability. Note that in FIG. 6, cathode support plate 14 is depicted as having a triangular shape. This shape is not an essential feature of the design and may be circular, square, or any of a multitude of other possible shapes without detracting from the intent of the invention.

The dimensions of any particular electron beam gun 1 of the present invention are dependent upon the gun operating voltage and required power output, however, the basic design philosophy described can be utilized over a wide range of voltages and powers. With this consideration, the following is a further discussion of the design details of the working model of the electron beam gun of the present invention which has been constructed by the inventors.

The working model of electron beam gun 1 has an operating range of up to 60 kV and an output power of 100's of kW. The emitting surface of cathode 10 is 0.75 inches (1.9 cm) in diameter and situated 0.75 inches (1.9 cm) from the tip of anode 20. As previously mentioned, emitter 10 itself is fabricated from tungsten. Cathode support plate 14 and cathode focus electrode 18 are fabricated from molybdenum because of its strength and low vapor pressure at high temperatures. This is important because during gun operation, the cathode structure temperatures exceed 1000° C. Cathode focus electrode 18 is attached to cathode support plate 14 using molybdenum bolts. No lubricant was used during assembly and care must be used during disassembly to avoid binding of the screws.

High voltage insulators 16 are made of alumina and are 2.75 inches (7.0 cm) long and 0.75 inches (1.9 cm) in diameter. Alumina was chosen by the inventors because of its insulating and vacuum properties, its strength, and the high tolerances which can be achieved and maintained during machining. To obtain the required high tolerances (±0.0005 inches), shoulders 17 of insulators 16 are ground in the final fabrication step. The mating surfaces on cathode support plate 14 and anode 20 also require the same tolerance specifications.

Anode 20 is fabricated from copper, which is superior to graphite and molybdenum in this application due to its high thermal conductivity and ease of machining and brazing. Anode aperture 22 is 0.79 inches (2.0 cm) in diameter to allow clearance for the electron beam. Too large a size for aperture 22 will lead to reduced gun performance, while too small a size will result in unwanted heating caused by electrons striking anode 20. Note that milliamps/cm$^2$ of beam current hitting anode 20 equates to tens of watts/cm$^2$ power densities at the beam energies under discussion.

Focus coils 30 which include poles 32, coil windings 34, and cooling channels 40, are 3 inches (7.6 cm) long and 6 inches (15.2 cm) in diameter. Poles 32 were fabricated from carbon steel, because of its magnetic properties, while coil windings 34 were made from #16 insulated magnet wire. Coil windings 34 produce a 500 Gauss field along the axis at the midplane when an excitation current to 5.0 amperes is applied. Cooling channel 40 located in the focus coil bore is made of copper and filtered water is used as the coolant. The inner bore of focus coil 30 is 1.75 inches (4.45 cm). Focus coil 30 slides over anode tube 23 as shown in FIG. 1 which is fixed to the back of anode 20. Tube 23 is brazed to produce a good thermal connection between the two parts. Close tolerancing between the innerbore of focus coil 30, anode structure 20, and anode tube structure 23 allows for self centering of the components with positive seating. The anode bore in the vicinity of focus coil 34 is 1.375 inches (3.5 cm). Anode tube 23 and focus coil 30 touch at two points designated by 41 and 42 in FIG. 5 to minimize heat transfer from anode tube 23 to focus coil 34.

Although specific materials have been mentioned in the description of the working model, the electron beam gun design of the present invention is not dependent on such a choice of materials and can be fabricated using any suitable materials known to those skilled in the art.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A self-aligning electron beam gun, comprising:
    a cathode emitter assembly which contains a cathode which serves as a source of electrons;
    a cathode support plate adapted to receive the cathode emitter assembly so as to align the cathode in an operable manner without the need for further adjustment;
    a high voltage insulator having two ends, wherein a first end is engaged with the cathode support plate;
    an anode, wherein the anode is mechanically coupled to the cathode support plate, the anode affixed to the second end of the high voltage insulator, wherein the coupling of the anode to the cathode support plate serves to align the anode and the cathode in an operable manner without the need for further adjustment; and
    a cathode focus electrode disposed on the cathode support plate so as to produce an electric field between the cathode focus electrode and the anode, wherein the electric field serves to accelerate the electrons produced by the cathode and direct them through the anode to an intended target.

2. The electron beam gun of claim 1, wherein the cathode is fabricated from tungsten.

3. The electron beam gun of claim 1, wherein the anode is fabricated from copper.

4. The electron beam gun of claim 1, wherein the high voltage insulator is fabricated from alumina.

5. The electron beam gun of claim 1, wherein the cathode focus electrode is fabricated from molybdenum.

6. The electron beam gun of claim 1, wherein the cathode support plate and cathode focus electrode are fabricated as a single element.

7. The electron beam gun of claim 1, wherein the cathode support plate is triangular and three high voltage insulators are used to couple the cathode support plate to the anode.

8. The electron beam gun of claim 1, wherein the cathode is fabricated by using the technique of Electric Discharge Machining (EDM).

9. In an electron beam gun of the type having a cathode which provides a source of electrons, and a cathode focus electrode and anode, wherein between the cathode focus electrode and anode an electric field is formed to accelerate the electrons produced by the cathode through the anode to an intended target, the improvement comprising:

a cathode support plate adapted to receive the cathode so as to align the cathode in an operable manner without the need for further adjustment; and a high voltage insulator which mechanically couples the anode to the cathode support plate so as to align the anode and cathode in an operable manner without the need for further adjustment, the high voltage insulator having two ends, wherein a first end of the insulator is engaged with the cathode support plate and the second end is affixed to the anode.

10. The improved electron beam gun of claim 9, wherein the cathode support plate is triangular and three high voltage insulators are used to couple the cathode support plate to the anode.

11. The improved electron beam gun of claim 9, wherein the cathode support plate and cathode focus electrode are fabricated as a single element.

* * * * *